(12) United States Patent
Yuasa et al.

(10) Patent No.: US 8,448,599 B2
(45) Date of Patent: *May 28, 2013

(54) DEVICE FOR PROCESSING A SUBSTRATE, METHOD OF PROCESSING A SUBSTRATE AND METHOD OF MANUFACTURING SEMICONDUCTOR DEVICE

(75) Inventors: Kazuhiro Yuasa, Takaoka (JP); Kazuhiro Kimura, Toyama (JP); Yasuhiro Megawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 5 days.

This patent is subject to a terminal disclaimer.

(21) Appl. No.: 13/137,023

(22) Filed: Jul. 15, 2011

(65) Prior Publication Data

US 2011/0271907 A1 Nov. 10, 2011

Related U.S. Application Data

(63) Continuation of application No. 12/656,497, filed on Feb. 1, 2010, now Pat. No. 8,003,411, which is a continuation of application No. 12/225,118, filed as application No. PCT/JP2007/062594 on Jun. 22, 2007, now Pat. No. 7,682,987.

(30) Foreign Application Priority Data

Jun. 28, 2006 (JP) .................................. 2006-178022

(51) Int. Cl.
*C23C 16/52* (2006.01)
*C23C 16/455* (2006.01)
*C23C 16/40* (2006.01)

(52) U.S. Cl.
USPC .......................................................... 118/663

(58) Field of Classification Search
USPC ........................................ 118/663, 715–725
See application file for complete search history.

(56) References Cited

U.S. PATENT DOCUMENTS

| 6,274,507 B1 | 8/2001 | Narita et al. |
| 7,682,987 B2 * | 3/2010 | Yuasa et al. ................... 438/765 |
| 2004/0175666 A1 | 9/2004 | Saito |

FOREIGN PATENT DOCUMENTS

| EP | 1 414 061 A1 | 4/2004 |
| JP | A-08-139085 | 5/1996 |
| JP | A-10-223622 | 8/1998 |
| JP | A-2003-045867 | 2/2003 |

OTHER PUBLICATIONS

Oct. 30, 2009 Notice of Allowance issued in U.S. Appl. No. 12/225,118.
Apr. 15, 2011 Notice of Allowance issued in U.S. Appl. No. 12/656,497.

* cited by examiner

*Primary Examiner* — Calvin Lee
*Assistant Examiner* — Monica D Harrison
(74) *Attorney, Agent, or Firm* — Oliff & Berridge, PLC

(57) ABSTRACT

Provided is a substrate processing apparatus and a method of manufacturing a semiconductor device, which are hard to cause a defect in processing a substrate owing to that a pressure inside a process chamber is not kept constant, and which enable a better processing of a substrate.

16 Claims, 7 Drawing Sheets

DEVICE FOR PROCESSING A SUBSTRATE, METHOD OF PROCESSING A SUBSTRATE AND METHOD OF MANUFACTURING SEMICONDUCTOR DEVICE

CROSS-REFERENCE TO RELATED APPLICATIONS

This is a Continuation of application Ser. No. 12/656,497 filed Feb. 1, 2010, which is Continuation of application Ser. No. 12/225,118 filed Oct. 3, 2008, which in turn is a National Phase of PCT/JP2007/062594 filed Jun. 22, 2007, which in turn claims the benefit of Japanese Application No. JP 2006-178022, filed Jun. 28, 2006. The disclosure of the prior applications is hereby incorporated by reference herein in its entirety.

BACKGROUND

The present invention relates to a substrate-processing device for performing a process of a substrate including oxidization of a substrate surface of a semiconductor wafer, a glass substrate and the like, and a method of manufacturing a semiconductor device including the step of performing such process of a substrate.

A technique used for a substrate-processing device and a substrate-processing method of this type has been known, and the technique includes a process chamber for processing a substrate, a supplying line for supplying a reactive gas into the process chamber, and an exhaust line for exhausting the process chamber.

SUMMARY

However, conventionally in the step of performing a treatment e.g. thermal oxidization of a surface of a substrate, the differential pressure between a pressure of the inside of a process chamber and a pressure of the outside of the process chamber is measured, and the pressure inside the process chamber is controlled based on a result of the measurement. Therefore, it has been difficult to keep the pressure inside the process chamber constant because when the pressure of the outside of the process chamber is changed by e.g. a climate change, the inside pressure of the process chamber is changed with this change. There has been a problem such that e.g. the variation in thickness of an oxide film owing to thermal oxidization arises, and thus a substrate cannot be processed well.

The invention aims to provide a substrate-processing device and a method of manufacturing a semiconductor device, which are hard to cause a defect in processing a substrate owing to that a pressure inside a process chamber is not kept constant, and which enable a better processing of a substrate.

According to an embodiment of the invention is provided a substrate-processing device including: a process chamber for processing a substrate; a reactive gas-supplying module for supplying a reactive gas into the process chamber; a reactive gas-supplying line for supplying the reactive gas from the reactive gas-supplying module into the process chamber; an exhaust line for exhausting the process chamber; a pump provided on the exhaust line for vacuumizing inside the process chamber; a pressure-adjusting valve provided in the exhaust line for adjusting a pressure in the process chamber; a first pressure-measuring instrument for measuring a pressure of an inside of the process chamber; a second pressure-measuring instrument for measuring a differential pressure between the inside pressure of the process chamber and an outside pressure thereof; and a controller which controls the pressure-adjusting valve based on a value of the inside pressure of the process chamber measured by the first pressure-measuring instrument so as to keep the inside pressure of the process chamber constant, and controls the reactive gas-supplying module based on a value of the differential pressure measured by the second pressure-measuring instrument so as to allow supply of the active gas into the process chamber in a case of the inside pressure of the process chamber being smaller than the outside pressure thereof, and so as to preclude supply of the reactive gas into the process chamber in a case of the inside pressure of the process chamber being larger than the outside pressure thereof when processing the substrate.

According to another embodiment of the invention is provided a substrate-processing device including: a process chamber for processing a substrate; a reactive gas-supplying line for supplying a reactive gas into the process chamber; an exhaust line for exhausting the process chamber; a pump provided on the exhaust line for vacuumizing inside the process chamber; a pressure-adjusting valve provided in the exhaust line for adjusting a pressure in the process chamber; a first pressure-measuring instrument for measuring a pressure of an inside of the process chamber; a second pressure-measuring instrument for measuring a differential pressure between the inside pressure of the process chamber and an outside pressure thereof; a lid for hermetically closing an opened portion of the process chamber to take in and out the substrate; and a controller which controls the pressure-adjusting valve based on a value of the inside pressure of the process chamber measured by the first pressure-measuring instrument so as to keep the inside pressure of the process chamber constant when processing the substrate, and after the processing of the substrate, performs control based on the value of the differential pressure measured by the second pressure-measuring instrument so that disablement of the hermetically closing by the lid is allowed when the differential pressure falls within an allowable range, and so that disablement of the hermetically closing by the lid is precluded when the differential pressure falls outside the allowable range.

According to still another embodiment of the invention is provided a method of manufacturing a semiconductor device including the steps of: bringing a substrate into a process chamber; processing the substrate while supplying a reactive gas into the process chamber with the substrate brought therein and vacuumizing inside the process chamber; and bringing out the processed substrate from the process chamber, wherein the step of processing the substrate includes measuring a pressure of an inside of the process chamber, and in parallel, keeping the inside pressure of the process chamber constant based on a measurement thereof, and measuring a differential pressure between the inside pressure of the process chamber and an outside pressure thereof, and based on a measurement thereof, supplying the reactive gas into the process chamber when the inside pressure of the process chamber is smaller than the outside pressure thereof, provided that when the inside pressure of the process chamber is larger than the outside pressure thereof, the reactive gas is not supplied into the process chamber.

Further, according to another embodiment of the invention is provided a method of manufacturing a semiconductor device including the steps of: bringing a substrate into a process chamber; processing the substrate while supplying a reactive gas into the process chamber with the substrate brought therein and vacuumizing inside the process chamber; and bringing out the processed substrate from the process chamber, wherein the step of processing the substrate includes measuring a pressure of an inside of the process chamber, and in parallel, keeping the inside pressure of the process chamber constant based on a measurement thereof, and after the processing of the substrate, measuring a differential pressure between the inside pressure of the process chamber and an outside pressure thereof, and the step of processing the substrate includes, depending on a measurement thereof, bringing out the processed substrate when the differential pressure falls within an allowable range, whereas when the differential pressure falls outside the allowable range, the step of bringing out the processed substrate is not executed.

The invention provides a substrate-processing device and a method of manufacturing a semiconductor device, which are hard to cause a defect in processing a substrate owing to that a pressure inside a process chamber is not kept constant, and which enable a better processing of a substrate.

DETAILED DESCRIPTION OF EMBODIMENTS

Figure 1:
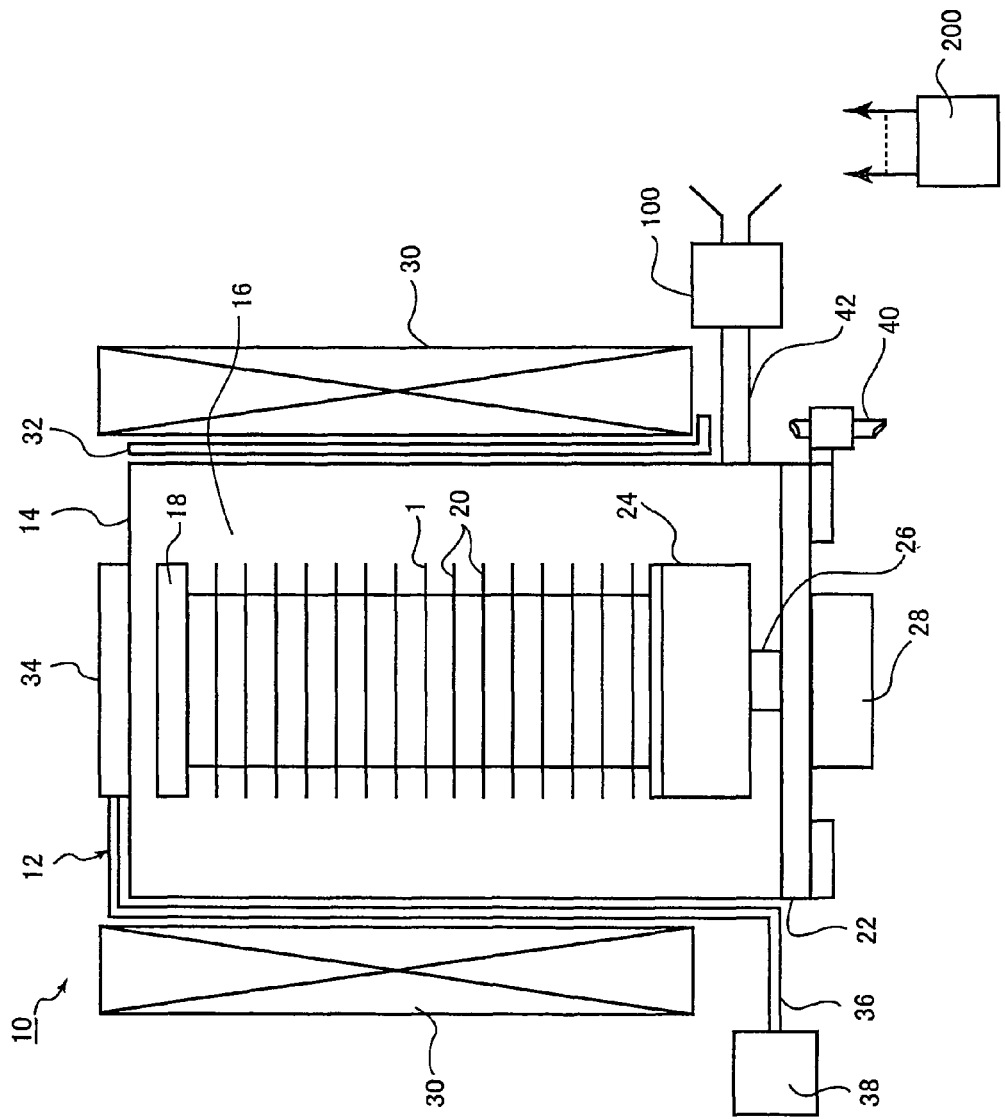
FIG. 1 is a sectional view showing a substrate-processing device according to an embodiment of the invention.

Now, the embodiments of the invention will be described with reference to the drawings. FIG. 1 shows a substrate-processing device 10 according to an embodiment of the invention. The substrate-processing device 10 is a vertical semiconductor manufacturing system of batch-processing type, which has a reaction furnace 12 for performing a process such as thermal oxidization on a substrate. The reaction furnace 12 has a cylindrical reaction tube 14 made of e.g. quartz with its upper end closed and the lower end opened; the reaction tube 14 forms a process chamber 16.

In the process chamber 16, a boat 18 each used as a retainer for supporting a substrate is inserted. The boat 18 is made of e.g. quartz or silicon carbide. The boat is, arranged so that it can hold wafers 20 made of silicon and used as substrates in two or more sections in the state where the substrates are kept in substantially horizontal positions, and aligned with one another in their center positions, and have gaps therebetween (at intervals of a substrate pitch).

The boat 18 is supported by a cylindrical heat-insulating cap 24 used as a heat-insulating member. The heat-insulating cap 24 is made of e.g. quartz or silicon carbide, and arranged so that it becomes hard to transfer the heat from a heater 30 to be described later downwards. To the heat-insulating cap 24, a rotation shaft 26 is attached; the rotation shaft 26 extends through a seal cap 22 to be described later, and is coupled with a rotation device 28 having a driving-power source, e.g. a motor, used as a rotation means (a rotation mechanism). The rotation device 28 is fixed to the later described seal cap 22. Accordingly, a rotational driving power from the rotation device 28 is transmitted to the heat-insulating cap 24 through the rotation shaft 26, and then the heat-insulating cap 24, the boat 18, and the wafers 20 held by the boat 18 are rotated.

In the lower end of the reaction tube 14 on the downside in the direction of the gravity (a vertical direction), an opened portion is formed; the boat 18 is inserted into the reaction tube 14 through the opened portion. The seal cap 22 used as a lid is attached on the opened portion of the reaction tube 14 from the downside in the direction of the gravity. The reaction tube 14 is structured so that it is hermetically closed by the seal cap 22. The seal cap 22 is provided perpendicularly to an outer portion of the reaction tube 14, and arranged so that it can be lifted up and down by a boat elevator 40 used as a lifting mechanism in a vertical direction. Thus, the boat 18 can be brought into and brought out from the process chamber 16. As stated here, when the boat elevator 40 lifts up the seal cap 22 and thus the seal cap 22 abuts against the reaction tube 14, the process chamber 16 is brought to a hermetically closed state, whereas when the boat elevator 40 lifts down the seal cap 22 and thus the seal cap 22 is made to be spaced apart from the reaction tube 14, the reaction chamber 16 is released from the hermetically closed state. As stated above, a combination of the boat elevator 40 and seal cap 22 is used as a hermetically-closing device for hermetically closing the process chamber 16, and also used as a releasing device for releasing the process chamber 16 from the hermetically closed state.

Around the reaction tube 14, a heater 30 used as a heating means (heating mechanism) for heating the wafers 20 is disposed in a circular form concentric with the reaction tube 14. Between the reaction tube 14 and the heater 30, a temperature sensor 32 used as a temperature-detecting means (temperature detector) is disposed.

On the top of the reaction tube 14 is fixed a showerhead 34, with which a supplying line 36 composed of e.g. a piping member is coupled. On the side opposite to the side where the showerhead 34 of the supplying line 36 is coupled, a reactive gas-supplying device 38 is fixed. Therefore, a reactive gas supplied from the reactive gas-supplying device 38 goes through the supplying line 36 and reaches the showerhead 34, and the reactive gas which has reached the showerhead 34 is supplied into the process chamber 16 while the reactive gas is dispersed by the showerhead 34. The detail of the reactive gas-supplying device 38 is to be described later.

To the reaction tube 14, an exhaust line 42 composed of e.g. a piping member for exhausting the process chamber 16 is fixed. On the side opposite to the exhaust line 42 of the reaction tube 14, a pressure-control device 100 used as a control means (pressure controller) for controlling the pressure inside the process chamber 16 is fixed. The detail of the pressure-control device 100 is to be described later.

The reactive gas-supplying device 38 is shown in FIG. 2.

Figure 2A:
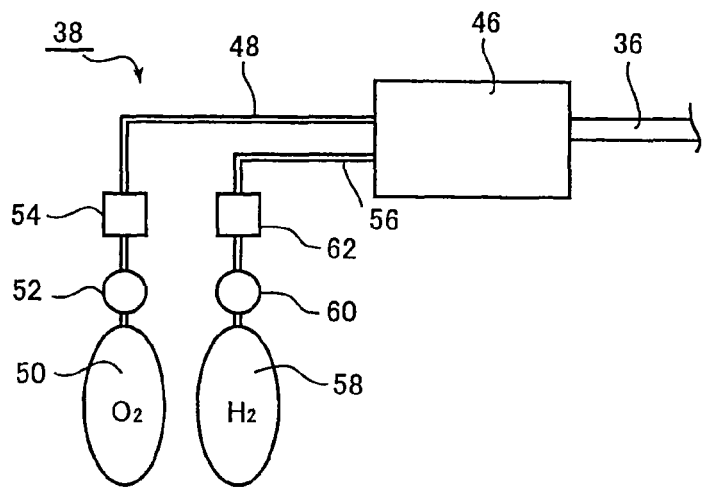
FIG. 2 is a set of explanatory views showing a configuration of a reactive gas-supplying device used in the embodiment of the invention, of which the portion (a) is an explanatory view for explaining a configuration for supplying a gas of water vapor produced by combustion of a gaseous mixture containing hydrogen gas and oxygen gas, the portion (b) is an illustration for explaining a configuration for supplying a gaseous mixture of oxygen and at least not less than one kind of gas selected from a group consisting of nitrogen gas, hydrogen chloride and dichloroethylene, and the portion (c) is an illustration showing a configuration for supplying a gaseous mixture of oxygen, hydrogen and at least not less than one kind of gas selected from a group consisting of nitrogen gas, hydrogen chloride and dichloroethylene.

In FIG. 2(a), the reactive gas-supplying device 38 has a combustion device 46 such as an external combustion device. The combustion device 46 is connected to the process chamber 16 (see FIG. 1) through the showerhead 34 by the supplying line 36. The combustion device 46 is connected with an oxygen gas source 50 formed by e.g. an oxygen tank through an oxygen gas-supplying line 48 composed of e.g. a piping member. In locations between the combustion device 46 and the oxygen gas source 50 on the oxygen gas-supplying line 48, an electromagnetic valve 52 and a mass-flow controller 54 are provided in order from the side of the oxygen gas source 50. The electromagnetic valve 52 is used as an opening-and-closing valve for controlling supply of oxygen to the combustion device 46/stop thereof, and the mass-flow controller 54 is used as a flow-rate controller for adjusting the flow rate of oxygen supplied to the combustion device 46.

In addition, the combustion device 46 is connected with a hydrogen gas source 58 formed by e.g. a hydrogen tank through a hydrogen gas-supplying line 56 composed of e.g. a piping member. In locations between the combustion device 46 and the hydrogen gas source 58 on the hydrogen gas-supplying line 56, an electromagnetic valve 60 and a mass-flow controller 62 are provided in order from the side of the hydrogen gas source 58. The electromagnetic valve 60 is used for controlling supply of hydrogen to the combustion device 46/stop thereof, and the mass-flow controller 62 is used for adjusting the flow rate of hydrogen supplied to the combustion device 46.

Oxygen and hydrogen are supplied from the oxygen gas source 50 and the hydrogen gas source 58 to the combustion device 46 at a given gas ratio by controlling the mass-flow controllers 54 and 62. Then, the combustion device 46 supplies a gas of water vapor produced by burning oxygen and hydrogen to the process chamber 16 (see FIG. 1) through the supplying line 36 and the showerhead 34. Incidentally, oxygen which has not been consumed by the burning during the time is also supplied to the process chamber 16 through the supplying line 36 and the showerhead 34. In addition, nitrogen for dilution is supplied to the process chamber 16 through the supplying line 36 and the showerhead 34 as required.

Figure 2B:
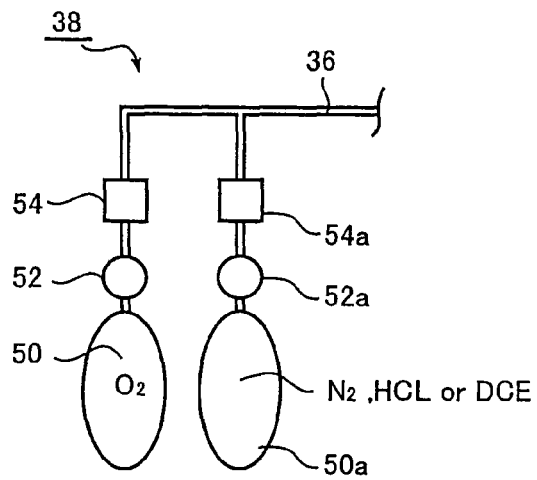
Figure 2C:
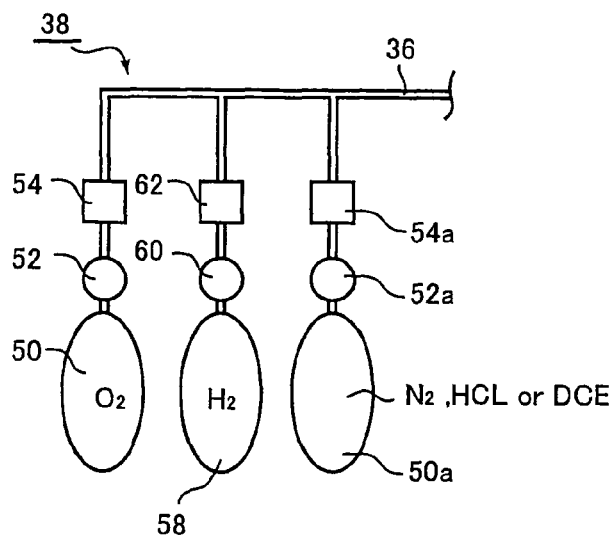

In this embodiment, an arrangement such that water vapor gas ($H_2O$) obtained by burning a gaseous mixture of hydrogen gas ($H_2$) and oxygen gas ($O_2$) in the combustion device 46 is supplied is adopted for the reactive gas-supplying device 38. However, instead of this arrangement, the reactive gas-supplying device 38 may be arranged so as to supply a gaseous mixture of oxygen and at least not less than one kind of gas selected from a group consisting of nitrogen gas ($N_2$), hydrogen chloride (HCl) and dichloroethylene ($C_2H_2Cl_2$(abbreviated to DCE)) as shown in FIG. 2(b). Also, as shown in FIG. 2(c), the reactive gas-supplying device 38 may be arranged so as to supply a gaseous mixture of oxygen ($O_2$) and hydrogen ($H_2$), and at least not less than one kind of gas selected from a group consisting of nitrogen gas ($N_2$), hydrogen chloride (HCl) and dichloroethylene ($C_2H_2Cl_2$). Now, it is noted that in FIGS. 2(b) and 2(c), 50a, 52a and 54a denote a gas source of nitrogen gas ($N_2$), hydrogen chloride (HCl) or dichloroethylene ($C_2H_2Cl_2$), an electromagnetic valve and a mass-flow controller, respectively. Also, the reactive gas-supplying device 38 may be arranged so as to supply only oxygen gas.

Figure 3:
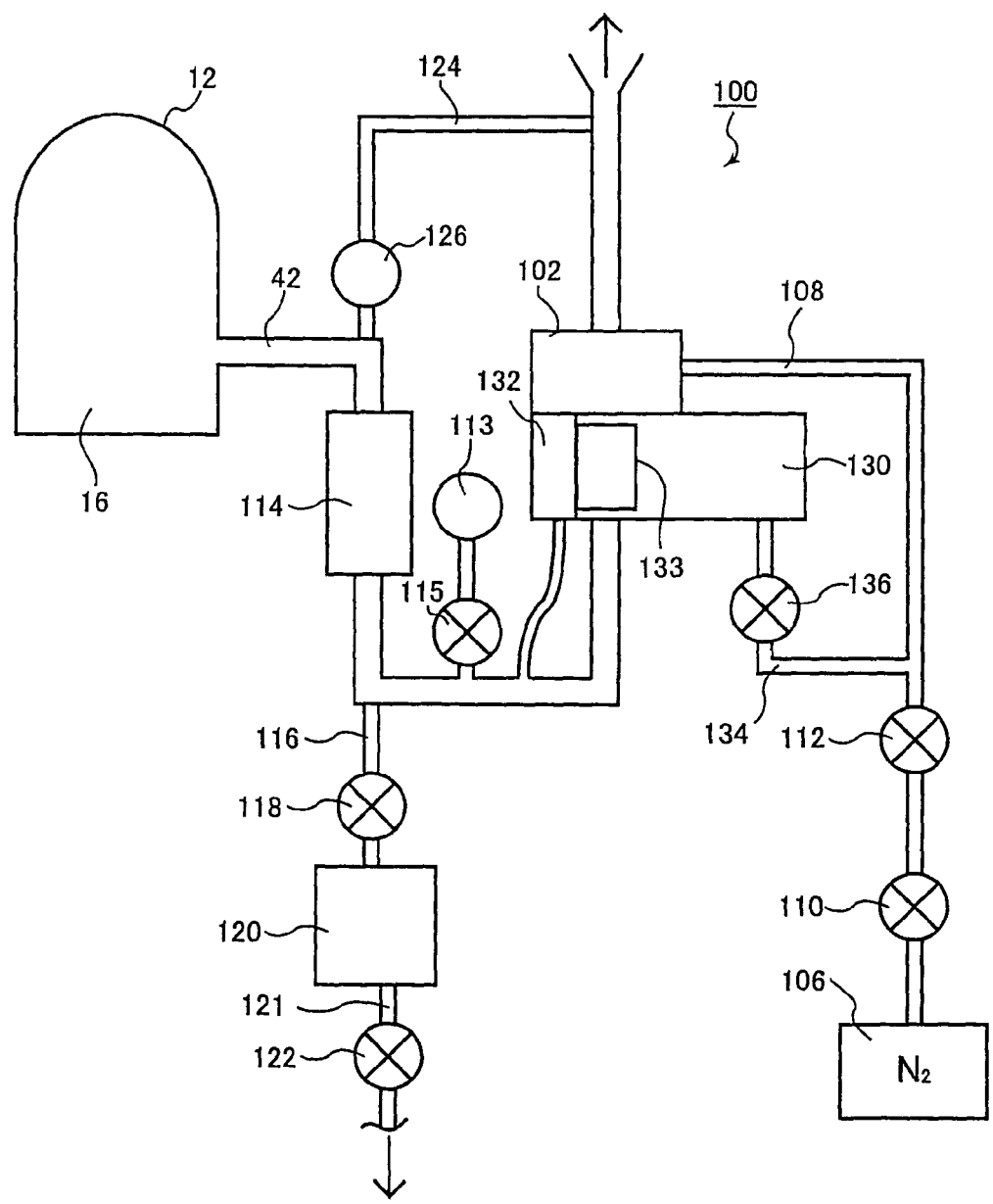
FIG. 3 is an explanatory view showing a configuration of a pressure-control device used in the embodiment of the invention.

FIG. 3 shows configurations of the pressure-control device 100 and a surrounding of the pressure-control device 100. The pressure-control device 100 has a relative pressure gauge 113 used as a second pressure-measuring instrument. The relative pressure gauge 113 is fixed to the exhaust line 42 through an electromagnetic valve 115, and measures the differential pressure between the inside pressure of the process chamber 16 and the outside pressure thereof. The electromagnetic valve 115 is used in an opened state normally, however it is brought to a closed state when a corrosive gas e.g. HCl is used as a reactive gas. Bringing the electromagnetic valve 115 to the closed state stops supply of the corrosive gas to the relative pressure gauge 113, and thus the relative pressure gauge 113 is prevented from being damaged by corrosion. In the case of using a corrosive gas in this way, the relative pressure gauge 113 is kept from contact with the corrosive gas by closing the electromagnetic valve 115 provided between the relative pressure gauge 113 and the exhaust line 42, and therefore the relative pressure gauge 113 can be prevented from being damaged by corrosion. It is noted that using a corrosion-resistant relative pressure gauge as the relative pressure gauge 113 eliminates the need for closing the electromagnetic valve 115 provided between the relative pressure gauge 113 and the exhaust line 42, and therefore it becomes possible to constantly monitor the differential pressure between the inside pressure of the process chamber 16 and the outside pressure thereof in the case of using a corrosive gas.

In a location between the location of the exhaust line 42 where the relative pressure gauge 113 is fixed and the location where the exhaust line 42 is connected to the process chamber 16, a gas cooler 114 is fixed. The gas cooler 114 is used as a cooling means (cooling mechanism) for cooling a reactive gas (water vapor) exhausted from the process chamber 16, which uses a cooling water to cool the reactive gas, thereby causing condensation of the reactive gas. Unreacted gases including the reactive gas and oxygen gas, which have not been condensed by cooling by the gas cooler 114, and nitrogen gas, are exhausted to the outside of the system by a pump 102, which is to be described later.

In a location downstream from the location where the gas cooler 114 of the exhaust line 42 is fixed and upstream from the location where the relative pressure gauge 113 is fixed, a drain line 116 is connected. The drain line 116 is composed of e.g. a piping member, and used to exhaust moisture resulting from condensation of the reactive gas by the gas cooler 114. The drain line 116 is connected to a drain tank 120 through an electromagnetic valve 118. Moisture resulting from condensation of the reactive gas by the gas cooler 114 flows into the drain tank 120 through the drain line 116, and the moisture thus having flowed into the tank is stored there. To the drain tank 120, a discharge line 121 is connected so as to be located, for example, below the drain tank 120 in the direction of the gravity. To the discharge line 121 is fixed an electromagnetic valve 122. The moisture discharged into the drain tank 120 can be stored by bringing the electromagnetic valve 122 to the closed state, and the moisture stored in the drain tank 120 is discharged to the outside of the system by bringing the electromagnetic valve 122 to the opened state. Incidentally, the discharge of the moisture stored in the drain tank 120 to the outside of the system is performed by closing the electromagnetic valve 118 and opening the electromagnetic valve 122 after the pressure inside the process chamber 16 has been returned to a atmospheric pressure after oxidization of a wafer.

At a location on the exhaust line 42 between the location where the gas cooler 114 is fixed and the process chamber 16, an atmospheric pressure-vent line 124 composed of e.g. a piping member, is fixed. The atmospheric pressure-vent line 124 allows a portion of the exhaust line 42 upstream from the gas cooler 114 and a portion of the exhaust line 42 downstream from the pump 102 to communicate with each other through the electromagnetic valve 126. When the relative pressure gauge 113 measures a pressure of the inside of the process chamber 16, and the measurement is positive with respect to the pressure of the outside of the chamber, the electromagnetic valve 126 is brought to the opened state thereby to release the pressure inside the reaction chamber 16 through the atmospheric pressure-vent line 124, and to prevent an overpressure from being applied to the inside of the reaction chamber 16. The upstream end of the atmospheric pressure-vent line 124 may be connected to a stage behind the gas cooler 114 (downstream from the gas cooler 114) of the exhaust line 42, e.g. a portion of the drain line 116 upstream from the electromagnetic valve 118. The following are made possible by making the arrangement like this: to lower the temperature of a heated gas discharged from the atmospheric pressure-vent line 124 in using the atmospheric pressure-vent line 124 to exhaust; and to prevent a heated gas from adversely affecting the atmospheric pressure-vent line 124, a vicinity of a connection of the exhaust line 42 with the downstream end of the atmospheric pressure-vent line 124, and members constituting the exhaust line 42 and others downstream from the connection.

When the substrate-processing device 10 having only the relative pressure gauge 113 as stated above is used to form an oxide film on a wafer 20, the differential pressure between the inside pressure of the process chamber 16 and the outside pressure thereof are gauged by the relative pressure gauge 113. Then, an adjustment is made based on the result of the gauging so that the inside pressure of the process chamber 16 is lower than the outside pressure thereof by a fixed value at all times. Also, an adjustment is made to make the pressure inside the exhaust line 42 lower than that inside the process chamber 16 constantly. When making the inside pressure of the process chamber 16 lower than the outside pressure thereof in this way, it becomes harder for the reactive gas in the process chamber 16 to leak form the inside of the process chamber 16 to the outside of the process chamber 16. In addition, when making the pressure inside the exhaust line 42 lower than the inside pressure of the process chamber 16 in this way, the gas can be prevented from flowing backward from the side of the exhaust line 42 into the process chamber 16, and therefore a stable oxidization process can be achieved in the process chamber 16.

The substrate-processing device 10 having only the relative pressure gauge 113 adjusts the pressure inside the process chamber 16 based on a result of gauging by the relative pressure gauge 113 as stated above. However, the substrate-processing device regulates the internal pressure of the process chamber 16 so that the difference between the inside pressure of the process chamber 16 and the pressure of the outside of the process chamber 16 is constant, and therefore when the change in the atmospheric pressure owing to e.g. a climate change causes the fluctuation in the pressure of the outside of the process chamber 16, the inside pressure of the process chamber 16 is also changed depending on the change. In addition, there is a problem that the change in the pressure inside the process chamber 16 causes the variation in thickness of the oxide film formed on a wafer 20. In the case like this, it is needed to adjust the thickness by adjusting the time for the oxidization process or doing something like that.

Therefore, as to the substrate-processing device 10 according to this embodiment, better ways to make an arrangement for measuring the inside pressure of the process chamber 16 and to control the substrate-processing device 10 based on the result of the measurement of the pressure inside the process chamber 16 are devised, thereby reducing the tendency to cause the variation in thickness of the oxide film owing to that the pressure inside the process chamber 16 is not kept constant. In addition, in regard to the substrate-processing device according to the embodiment, better ways to make an arrangement for measuring the pressure inside the process chamber 16 and to control the substrate-processing device 10 based on the result of the measurement of the pressure inside the process chamber 16 are devised, thereby reducing the tendency of the gas to leak out from the process chamber 16.

As shown in FIG. 3, a pump 102 used as an exhausting means (exhausting device) for exhausting the process chamber 16 is provided in a location on the exhaust line 42 downstream from the location where the relative pressure gauge 113 is fixed. The pump 102 is composed of e.g. a vacuum pump, and has a venturi tube therein. To the venturi tube, a nitrogen gas source 106 used as a fluid-supplying means for supplying a fluid to the venturi tube is connected through e.g. a nitrogen-supplying line 108 composed of a piping member, etc. Between the nitrogen gas source 106 and the pump 102 on the nitrogen-supplying line 108, a regulator 110 and an electromagnetic valve 112 are provided in order from the side of the nitrogen gas source 106.

The regulator 110 is used to adjust the pressure of the nitrogen gas supplied to the venturi tube of the pump 102 to be a constant pressure, thereby regulating the flow rate of the nitrogen gas, and the pressure inside the process chamber 16 can be lowered below the atmospheric pressure by controlling the outflow rate of the exhaust gas led out from the process chamber 16 into the pump.

In a location on the exhaust line 42 downstream from the location where the relative pressure gauge 113 is fixed and upstream from the location where the pump 102 is fixed, an absolute pressure-control device 130 is fixed. The absolute pressure-control device 130 is used as a first pressure-measuring instrument, and has an absolute pressure gauge 132 for measuring the pressure inside the process chamber 16. The absolute pressure gauge 132 has a pressure-measurement point located in the vicinity of a pressure-measurement point of the relative pressure gauge 113.

The relative pressure gauge 113 measures the differential pressure between the inside pressure of the process chamber 16 and the outside pressure thereof as stated above, and exactly it measures the differential pressure (relative pressure) between an exhaust pressure inside the exhaust line 42 and a an atmospheric pressure of the outside of the process chamber 16 when the process chamber 16 is exhausted. The absolute pressure gauge 132 measures the inside pressure of the process chamber 16, and exactly it measures an exhaust pressure (absolute pressure) inside the exhaust line 42 when the process chamber 16 is exhausted. Now, it can be thought that a pressure loss is produced by the gas cooler 114, etc. provided between the pressure-measurement points inside the process chamber 16 and exhaust line 42, and therefore a pressure difference of about 50 to 100 Pa is developed. Hence, the pressure inside the process chamber 16 can be thought to be somewhat higher than the pressure of at the pressure-measurement point in the exhaust line 42 by the pressure loss attributed to the gas cooler 114, etc. and the control of the pressure inside the process chamber 16 is performed in consideration of this.

The absolute pressure-control device 130 is connected through the nitrogen-supplying line 134 and the nitrogen-supplying line 108 to the aforementioned nitrogen gas source 106. Specifically, the nitrogen-supplying line 134 branches out form the nitrogen-supplying line 108 at a location closer to the pump 102 in comparison to the electromagnetic valve 112. The nitrogen-supplying line 134 connects between the absolute pressure-control device 130 and the nitrogen gas source 106. On the nitrogen-supplying line 134, a regulator 136 is provided, which adjusts the pressure of nitrogen gas supplied to the absolute pressure-control device 130 to be a constant pressure thereby to regulate the flow rate of the nitrogen gas. The nitrogen gas supplied to the absolute pressure-control device 130 from the nitrogen gas source 106 is used to drive a pressure-adjusting valve 133 for adjusting the pressure of the process chamber 16, which is provided in the absolute pressure-control device 130.

Figure 4:
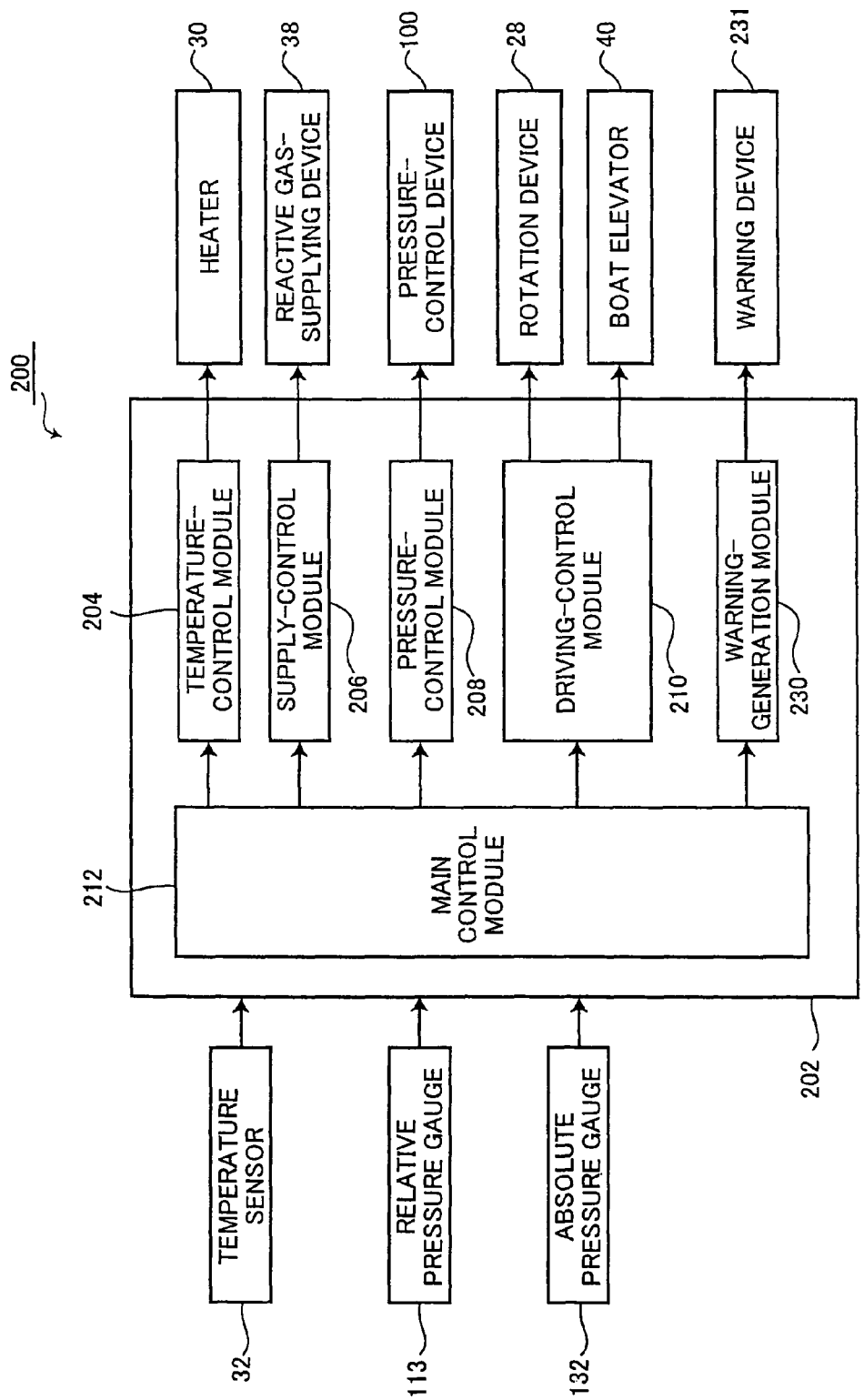
FIG. 4 is a block diagram showing a controller used in the embodiment of the invention.

A controller 200 that the substrate-processing device 10 has is shown in FIG. 4. The controller 200 has a control circuit 202; the control circuit 202 has a temperature-control module 204, a supply-control module 206, a pressure-control module 208, a driving-control module 210, and a warning-generation module 230. Also, the control circuit 202 has a main control module 212 for controlling the temperature-control module 204, the supply-control module 206, the pressure-control module 208, the driving-control module 210, and the warning-generation module 230. To the control circuit 202, signals from the temperature sensor 32, the relative pressure gauge 113, and the absolute pressure gauge 132 are input. According to outputs from the control circuit 202, the heater 30, the reactive gas-supplying device 38, the pressure-control device 100, the rotation device 28, the boat elevator 40, and the warning device 231 are controlled.

Figure 5:
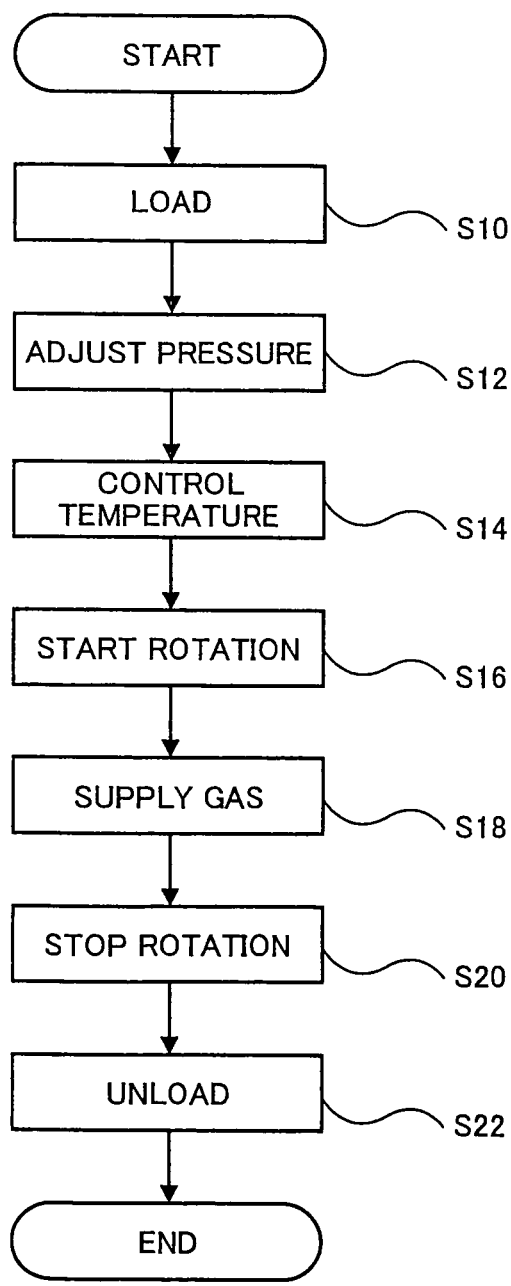
FIG. 5 is a flowchart showing a control flow of the controller used in the embodiment of the invention.

Next, a method of using the substrate-processing device 10 in association with the arrangement as described above to perform an oxidization process on a wafer 20 as a step of a manufacturing process of a semiconductor device (device) will be described. It is noted that in the description below actions of respective modules which constitute the substrate-processing device 10 are controlled by the controller 200. FIG. 5 shows a control flow of a wafer oxidization process according to the controller 200. First, in Step S 10 the controller 200 controls the boat elevator 40 and makes the boat elevator lift up the boat 18 holding wafers 20 into the process chamber 16, thereby to bring (load) the wafers 20 into the process chamber 16. At the time when loading of the wafers 20 into the process chamber 16 is completed, the reaction tube 14 is in the state where it is hermetically closed by the seal cap 22.

In the subsequent Step S12, the controller 200 controls the pressure-control device 100 to keep constant the inside pressure of the process chamber 16. Specifically, while using the pump 102 to exhaust the process chamber 16 to a vacuum condition, the controller 200 measures the exhaust pressure with the absolute pressure gauge 132 and performs feedback control of the pressure-adjusting valve 133 based on a signal input from the absolute pressure gauge 132, thereby to control the flow rate of the exhaust gas discharged from the process chamber 16 and to control the inside pressure of the process chamber 16. Incidentally, in parallel with the control of the pressure inside the process chamber 16, the controller 200 performs the control as described later based on a signal input from the relative pressure gauge 113.

In the pressure control of Step S12, the control is exercised so that the inside pressure of the process chamber 16 is made a pressure a bit lower than a minimum air pressure in fluctuations of atmosphere throughout the year. Concretely, the inside of the process chamber 16 is controlled to be at a pressure equal to or below 1000 hPa (hectopascal), which is a bit lower than an atmospheric pressure (i.e. slightly reduced pressure). Also, the inside of the process chamber 16 is controlled to be at a pressure equal to or above 800 hPa so as to prevent the reaction tube 14 made of quartz from being damaged.

Now, it is assumed originally that the system targeted in the embodiment of the invention is used under a pressure near the atmospheric pressure, and therefore a pressure below 800 hPa can cause damage to the reaction tube. In this respect, the reaction tube is different from a CVD reaction tube adapted for a reduced pressure such that e.g. a measure for dispersing a stress is taken by making the ceiling of the reaction tube round. Therefore, in this embodiment, the inside pressure of the process chamber 16 is controlled so as to be equal to or above 800 hPa. That is, the control is performed so that the inside of the process chamber 16 is at a pressure in a range of 800 to 1000 hPa.

It is preferable that the inside of the process chamber 16 is controlled to be at a pressure in a pressure range of 900 to 980 hPa. Controlling the inside of the process chamber 16 to be at 900 to 980 hPa allows combustion by the combustion device 46 to be continued well during the oxidization involving the ignition and burning reaction of hydrogen and oxygen as in this embodiment, i.e. pyrogenic oxidization.

In this way, the controller 200 performs control so that the pressure inside the process chamber 16 is kept constant, based on not the differential pressure between the inside pressure of the process chamber 16 and the outside pressure thereof, namely the relative pressure, but the inside pressure of the process chamber 16, namely the absolute pressure. Therefore, even when the pressure of the outside of the process chamber 16 is changed owing to e.g. a climate change, etc., the inside pressure of the process chamber 16 is not affected by it and the change thereof is not caused. Hence, the variation in the thickness of a formed film as caused when the pressure inside the process chamber 16 is not kept constant does not arise. This eliminates the need for adjusting the thickness of a film by adjustment of the process time for oxidization, and therefore the time for oxidization can be made constant. This can prevent the occurrence of a slight difference in rearrangement of impurities between wafers 20, which is caused by the change in diffusion lengths of impurities resulting from the change in thermal hysteresis with respect to the wafers 20 when the time for oxidization varies from batch to batch. The control of the pressure of the inside of the reaction chamber 16 is performed continuously until the rotation of the wafers 20 is stopped in Step S20.

In the subsequent Step S14, the controller 200 performs feedback control of the heater 30 based on a signal from the temperature sensor 32 thereby to keep the temperature inside the process chamber 16 substantially constant.

In the subsequent Step S16, the controller 200 controls the rotation device 28 to make the wafers 20 put in the process chamber 16 start rotation.

In the subsequent Step S18, the controller 200 controls the reactive gas-supplying device 38 to make the reactive gas-supplying device 38 supply the reactive gas to the process chamber 16. Specifically, the controller 200 controls the mass-flow controllers 54 and 62 thereby to have oxygen and hydrogen supplied to the combustion device 46 at a desired rate and to have water vapor supplied from the combustion device 46 to the process chamber 16. In this time, oxygen which has not been consumed by the combustion is also supplied into the process chamber 16. In addition, as required, the nitrogen for dilution is also supplied into the process chamber 16. The water vapor and oxygen to be supplied to the process chamber 16 are diffused by the showerhead 34 and reach surfaces of the wafers 20 in the state, to form oxide films on the surfaces of the wafers 20.

In the subsequent Step S20, the controller 200 controls the reactive gas-supplying device 38 to have the supply of the reactive gas to the process chamber 16 stopped, and controls the rotation device 28 to have the rotation of the wafers 20 stopped. Thereafter nitrogen is supplied to the process chamber 16 and the inside of the process chamber 16 is purged, and then the inside of the process chamber 16 is returned to the atmospheric pressure. In this time, the inside of the process chamber 16 is returned to the atmospheric pressure while the differential pressure between the inside pressure of the process chamber 16 and the outside pressure thereof is sensed by the relative pressure gauge 113.

In the subsequent Step S22, the controller 200 controls the boat elevator 40 to have the wafers 20, which are left supported by the boat 18 after completion of the oxidization process, brought out (unloaded) from the process chamber 16. It is noted that when in Step S22, a signal showing that the pressure difference between the inside and outside of the process chamber 16 is equal to or above a predetermined value, i.e. out of an allowable range has been input from the relative pressure gauge 113, the controller 200 prohibits the boat elevator 40 from being driven thereby to make it impossible to bring out the wafers 20 from the process chamber 16. In other words, it is prohibited to free the process chamber 16 from the hermetically closed state. Only in the case where a signal showing the pressure difference between the inside and outside of the process chamber 16 is below the predetermined value, i.e. within the allowable range has been input from the relative pressure gauge 113, the controller 200 allows the boat elevator 40 to be driven, thereby to enable the wafers 20 to be brought out from the process chamber 16. In other words, it is allowed to free the process chamber 16 from the hermetically closed state. In the case where there is the pressure difference between the inside and outside of the process chamber 16, this control can reduce the tendency of a rapid change in the pressure inside the process chamber 16 in taking out the wafers 20 from the process chamber 16 to damage the boat 18 and generate particles.

In the step of supplying the reactive gas of Step S18, when the inside pressure of the process chamber 16 is higher than the outside pressure thereof, the inside of the process chamber 16 is put in a pressurized state, posing the risk of causing leakage of the gas. Hence, in the substrate-processing step until the rotation of the wafers 20 is stopped in Step S20 since the adjustment of the pressure of the process chamber 16 is made in Step S12, when a signal showing that the inside pressure of the process chamber 16 is higher than the outside pressure thereof is input from the relative pressure gauge 113, the controller 200 prevents the electromagnetic valve 52 and electromagnetic valve 60 from being opened thereby to make it impossible to supply the process chamber 16 with water vapor if the valves are in the closed state. If the electromagnetic valve 52 and the electromagnetic valve 60 have been opened, the controller 200 brings the valves to their closed states to stop the supply of water vapor to the process chamber 16 thereby to stop processing the substrates. However, as long as a signal showing that the inside pressure of the process chamber 16 is lower than the outside pressure thereof is input from the relative pressure gauge 113 in the substrate-processing steps of Step S12 to Step S20, the controller 200 retains the electromagnetic valve 52 and the electromagnetic valve 60 in a condition that they can be brought to the opened state, and therefore maintains a condition that the reactive gas can be supplied from the reactive gas-supplying device 38 to the process chamber 16.

As stated above, the substrate-processing device 10 according to the embodiment is arranged so that the supply of the reactive gas is enabled only when the inside of the process chamber 16 is negative in pressure relative to the outside thereof by using the relative pressure gauge 113 to monitor the pressure difference between the inside and outside of the process chamber 16, and therefore the substrate-processing device uses the relative pressure gauge 113 as an interlock trigger. The cases where the inside pressure of the process chamber 16 is higher than the outside pressure thereof include a case such that the atmospheric pressure drops rapidly owing to the fluctuation in the atmospheric pressure, etc. below the pressure inside the process chamber 16.

In this embodiment, the substrate-processing device is arranged so that water vapor, which is a reactive gas, cannot be supplied into the process chamber 16 when the inside pressure of the process chamber 16 is higher than the outside pressure thereof However, water vapor has no toxicological property, and even if the water vapor somewhat leaks from inside the process chamber 16 to the outside, it causes no harm. Therefore, in the case of using a gas having no toxicological property like water vapor, even if the inside pressure of the process chamber 16 is higher than the outside pressure thereof, it is not necessary to disable the supply of the reactive gas into the process chamber 16.

In contrast, in the cases of using gases having corrosive and toxic properties, such as NO, $NO_x$, $N_2O$, $NH_3$, DCE and HCl, it is necessary to reliably prevent the gases from leaking from the inside of the process chamber 16 to the outside. It becomes indispensable to preclude supply of a reactive gas into the process chamber 16 when the inside pressure of the process chamber 16 is higher than the outside pressure thereof.

In addition, the substrate-processing device may be arranged so that in the substrate-processing steps of Step S12 to Step S20, when a signal showing that the inside pressure of the process chamber 16 is higher than the outside pressure thereof is input from the relative pressure gauge 113, the controller 200 controls the warning-generation module 230 to make the warning device 231 generate a warning. As the warning device 231 may be used e.g. a sound-producing device which produces a warning sound and a light-emitting device which emits a warning light.

Figure 6:
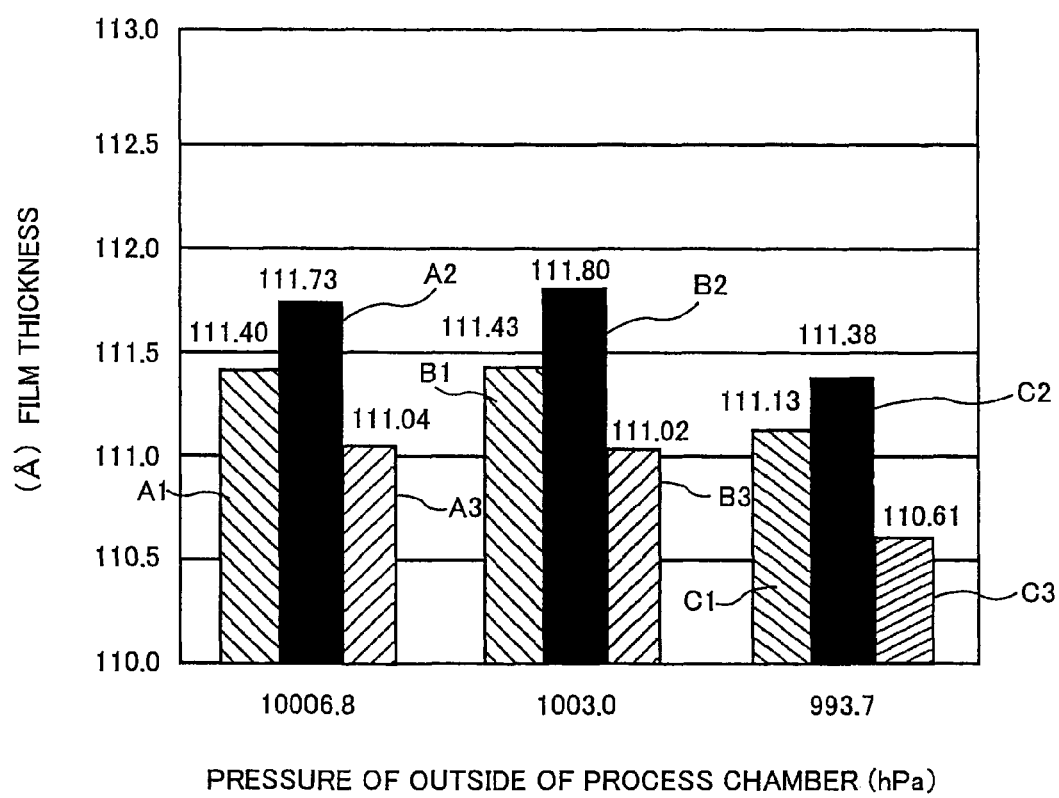
FIG. 6 is a graph showing the relation between the pressure of the atmospheric pressure and the film thickness of an oxide film formed on a substrate in the case of using the substrate-processing device according to the embodiment of the invention to perform an oxidization process.

FIG. 6 shows the relation between the pressure of the outside of the process chamber 16 and the film thickness of an oxide film formed on a wafer 20 in the case of using the substrate-processing device 10 according to the embodiment of the invention to perform an oxidization process. The horizontal axis shows the pressure of the outside of the process chamber 16 (hPa), and the vertical axis shows the film thickness (Angstrom) of a film formed on each wafer. In the horizontal axis of FIG. 6, the three pieces of data denoted by Condition A (A1, A2, A3) each show a film thickness of a film formed on a wafer 200 when the pressure of the outside of the process chamber 16 is 1006.8 hPa; A1, A2 and A3 show film thicknesses of films formed on wafers 20 disposed in an upper portion, a center portion and a lower portion of the process chamber 16, respectively.

Likewise, the pieces of data denoted by Condition B (B1, B2, B3) each show a film thickness of a film formed on a wafer 20 when the pressure of the outside of the process chamber 16 is 1003.0 hPa; B1, B2 and B3 show film thicknesses of films formed on wafers 20 disposed in the upper, center and lower portions of the process chamber 16, respectively. Further, likewise, the pieces of data denoted by Condition C (C1, C2, C3) each show a film thickness of a film formed on a wafer 20 when the pressure of the outside of the process chamber 16 is 993.7 hPa; C1, C2 and C3 show film thicknesses of films formed on wafers 20 disposed in the upper, center and lower portions of the process chamber 16, respectively. Now, it is noted that the pressure of the outside of the process chamber of the horizontal axis shows the fluctuation in the atmospheric pressure.

As is clear from the data shown in FIG. 6, even when the pressure of the outside of the process chamber 16, namely the atmospheric pressure fluctuates, the fluctuation in film thickness between the data or batches is suppressed to 0.17 percent.

Figure 7:
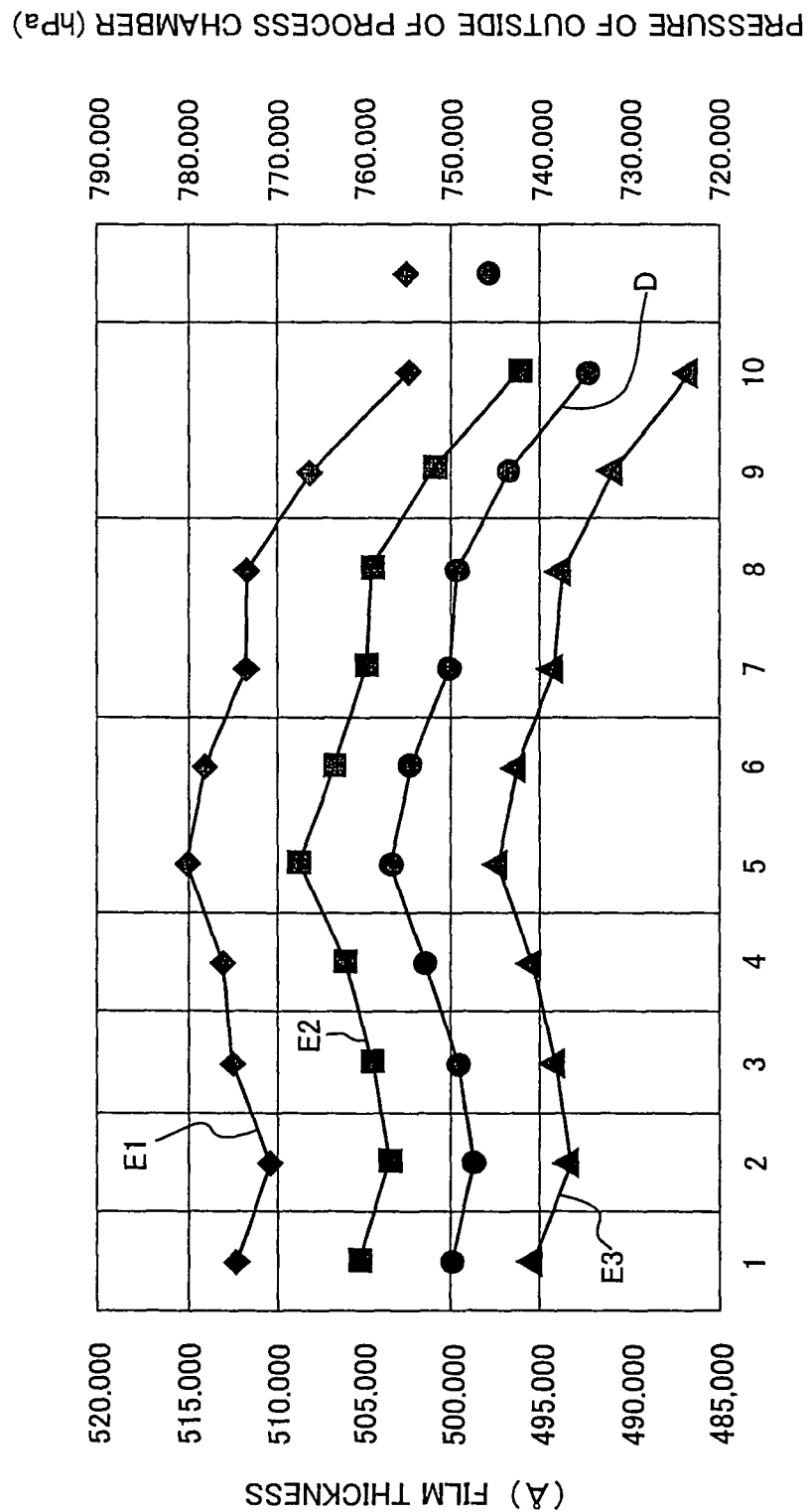
FIG. 7 is a graph showing the relation between the atmospheric pressure and the film thickness of an oxide film formed on a substrate in the case of using a substrate-processing device according to a comparative example to perform an oxidization process.

FIG. 7 shows the relation between the pressure of the outside of the process chamber 16 and the film thickness of an oxide film formed on each wafer 20 in the case of using a substrate-processing device according to a comparative example to process substrates. The vertical axis of the right side shows the pressure of the outside of the process chamber (mmHg), and the vertical axis of the left side shows the film thickness of a film formed on each wafer (Angstrom). In the substrate-processing device 10 according to the embodiment, the inside pressure of the process chamber 16 is controlled based on results of measurements by the absolute pressure gauge 132 while considering results of measurements by the relative pressure gauge 113. In contrast, the substrate-processing device according to the comparative example controls the pressure of the process chamber 16 based on only results of measurements by the relative pressure gauge 113. In other words, the substrate-processing device performs control based on results of measurements by the relative pressure gauge 113 so that the inside pressure of the process chamber 16 is lower than the outside pressure thereof by a fixed value.

In FIG. 7, D denotes the pressures of the outside of the process chamber 16 in Conditions 1 to 10, i.e. the fluctuation in the atmospheric pressure. E1, E2 and E3 show film thicknesses of films formed on wafers 20 disposed in the upper, center and lower portions of the process chamber 16 in Conditions 1 to 10, respectively. It is clear from FIG. 7 that in the substrate-processing device in association with the comparative example, the film thickness is increased when the atmospheric pressure is higher, and it decreased when the atmospheric pressure is lower, the film thickness of a film formed on each wafer 20 varies depending on the change in the pressure of the outside of the process chamber 16, i.e. the change in the atmospheric pressure, and the variation reaches up to 2.5 percent.

Now, the preferred embodiments of the invention will be described.

According to an embodiment of the invention is provided a substrate processing apparatus comprising: a process chamber for processing a substrate; a reactive gas-supplying module for supplying a reactive gas into the process chamber; a reactive gas-supplying line for supplying the reactive gas from the reactive gas-supplying module into the process chamber; an exhaust line for exhausting an inside of the process chamber; a pump provided in the exhaust line for vacuumizing the inside of the process chamber; a pressure-adjusting valve provided in the exhaust line for adjusting a pressure in the process chamber; a first pressure-measuring instrument for measuring an inside pressure of the process chamber; a second pressure-measuring instrument for measuring a differential pressure between the inside pressure of the process chamber and an outside pressure thereof; and a controller which controls the pressure-adjusting valve based on a value of the inside pressure of the process chamber measured by the first pressure-measuring instrument so as to keep the inside pressure of the process chamber constant, and controls the reactive gas-supplying module based on a value of the differential pressure measured by the second pressure-measuring instrument so as to allow supply of the reactive gas into the process chamber in a case of the inside pressure of the process chamber being smaller than the outside pressure thereof, and so as to preclude supply of the reactive gas into the process chamber in a case of the inside pressure of the process chamber being larger than the outside pressure thereof when processing the substrate.

It is preferable that the controller controls the reactive gas-supplying module so that a gaseous mixture composed of $O_2$ gas and at least not less than one kind of gas selected from a group consisting of $H_2O$ gas, which can be obtained by burning $H_2$ gas and $O_2$ gas, $N_2$ gas, HCl gas, $C_2H_2Cl_2$ gas and $H_2$ gas, or only $O_2$ gas is supplied into the process chamber as the reactive gas when processing the substrate.

It is preferable that the controller controls the reactive gas-supplying module so that a gas containing a corrosive or toxic gas is supplied into the process chamber as the reactive gas when processing the substrate.

It is preferable that the controller controls the pressure-adjusting valve so that the inside pressure of the process chamber is kept a constant pressure within a range of 800 to 1000 hPa when processing the substrate.

It is preferable that the controller controls the pressure-adjusting valve so that the inside pressure of the process chamber is kept a constant pressure within a range of 900 to 980 hPa when processing the substrate.

It is preferable that the controller further performs control based on the value of the differential pressure measured by the second pressure-measuring instrument so that the inside of the process chamber is allowed to be opened when the differential pressure falls within an allowable range, and opening the inside of the process chamber is precluded when the differential pressure falls outside the allowable range after the processing of the substrate.

It is preferable that the controller further performs control based on the value of the differential pressure measured by the second pressure-measuring instrument so that the processed substrate is allowed to be brought out from inside the process chamber when the differential pressure falls within an allowable range, and the processed substrate is precluded from being brought out from inside the process chamber when the differential pressure falls outside the allowable range after the processing of the substrate.

It is preferable that the substrate processing apparatus has: a support tool for supporting the substrate in the process chamber; a lid for supporting the support tool and hermetically closing an opened portion of the process chamber to take in and out the support tool; and a lifting mechanism for lifting up and down the lid thereby to lift up and down the support tool, wherein the controller further performs control based on the value of the differential pressure measured by the second pressure-measuring instrument so that the lifting mechanism is allowed to be driven when the differential pressure falls within an allowable range, and the lifting mechanism is prohibited from being driven when the differential pressure falls outside the allowable range after the processing of the substrate.

According to another embodiment of the invention is provided a substrate processing apparatus comprising: a process chamber for processing a substrate; a reactive gas-supplying line for supplying a reactive gas into the process chamber; an exhaust line for exhausting an inside of the process chamber; a pump provided in the exhaust line for vacuumizing the inside of the process chamber; a pressure-adjusting valve provided in the exhaust line for adjusting a pressure in the process chamber; a first pressure-measuring instrument for measuring an inside pressure of the process chamber; a second pressure-measuring instrument for measuring a differential pressure between the inside pressure of the process chamber and an outside pressure thereof; a lid for hermetically closing an opened portion of the process chamber to take in and out the substrate; and a controller which controls the pressure-adjusting valve based on a value of the inside pressure of the process chamber measured by the first pressure-measuring instrument so as to keep the inside pressure of the process chamber constant when processing the substrate, and after the processing of the substrate, performs control based on the value of the differential pressure measured by the second pressure-measuring instrument so that release of the hermetically closing by the lid is allowed when the differential pressure falls within an allowable range, and so that release of the hermetically closing by the lid is precluded when the differential pressure falls outside the allowable range.

According to still another embodiment of the invention is provided a method of manufacturing a semiconductor device comprising the steps of: bringing a substrate into a process chamber; processing the substrate while supplying a reactive gas into the process chamber with the substrate brought therein and vacuumizing inside the process chamber; and bringing out the processed substrate from the process chamber, wherein in the step of processing the substrate, an inside pressure of the process chamber is measured, and in parallel, the inside pressure of the process chamber is kept constant based on a measurement thereof, and a differential pressure between the inside pressure of the process chamber and an outside pressure thereof, and based on a measurement thereof is measured, the reactive gas is supplied into the process chamber when the inside pressure of the process chamber is smaller than the outside pressure thereof, and the reactive gas is not supplied into the process chamber when the inside pressure of the process chamber is larger than the outside pressure thereof.

Further, according to another embodiment of the invention is provided a method of manufacturing a semiconductor device comprising the steps of: bringing a substrate into a process chamber; processing the substrate while supplying a reactive gas into the process chamber with the substrate brought therein and vacuumizing inside the process chamber; and bringing out the processed substrate from the process chamber, wherein in the step of processing the substrate, an inside pressure of the process chamber is measured, and in parallel, the inside pressure of the process chamber is kept constant based on a measurement thereof, and after the processing of the substrate, a differential pressure between the inside pressure of the process chamber and an outside pressure thereof is measured, and based on a measurement thereof, the step of bringing out the processed substrate is executed when the differential pressure falls within an allowable range, whereas when the differential pressure falls outside the allowable range, the step of bringing out the processed substrate is not executed.

As stated above, the invention can be utilized for a substrate-processing device and a method of manufacturing a semiconductor device, which are for performing a process such as oxidization of a surface of a substrate composed of a semiconductor wafer, a glass substrate or the like.

What is claimed is:

1. A method of manufacturing a semiconductor device comprising the steps of:
   bringing a substrate into a process chamber;
   processing the substrate while supplying a reactive gas into the process chamber with the substrate brought in the process chamber; and
   bringing out the processed substrate from the process chamber,
   wherein in the step of processing the substrate,
   an inside pressure of the process chamber is measured and the inside pressure of the process chamber is led to a predetermined pressure based on a measurement of the inside pressure, and
   a differential pressure between the inside pressure of the process chamber and an outside pressure outside of the process chamber is measured, and based on the differential pressure, the reactive gas is supplied into the process chamber when the inside pressure of the process chamber is smaller than the outside pressure outside of the process chamber.

2. The method of manufacturing a semiconductor device according to claim 1,
   wherein in the step of processing the substrate,
   a gaseous mixture composed of $O_2$ gas and at least one kind of gas is selected from a group consisting of $H_2O$ gas, which can be obtained by burning $H_2$ gas and $O_2$ gas, $N_2$ gas, HCl gas, $C_2H_2Cl_2$ gas and $H_2$ gas, or only $O_2$ gas is supplied into the process chamber as the reactive gas.

3. The method of manufacturing a semiconductor device according to claim 1,
   wherein in the step of processing the substrate, a gas containing a corrosive or toxic gas is supplied into the process chamber as the reactive gas.

4. The method of manufacturing a semiconductor device according to claim 1,
   wherein in the step of processing the substrate, a gas containing at least one kind of gas is selected from a group consisting of NO gas, $No_x$ gas, $N_2O$ gas, $NH_3$ gas, $C_2H_2Cl_2$ gas and HCl gas.

5. A method of manufacturing a semiconductor device comprising the steps of:
   bringing a substrate into a process chamber;
   processing the substrate while supplying a reactive gas into the process chamber with the substrate brought into the process chamber; and
   bringing out the processed substrate from the process chamber,
   wherein in the step of processing the substrate,
   an inside pressure of the process chamber is measured and the inside pressure of the process chamber is led to a predetermined pressure based on a measurement of the inside pressure, and
   after the processing of the substrate, a differential pressure between the inside pressure of the process chamber and an outside pressure outside of the process chamber is measured, and based on the differential pressure, the step of bringing out the processed substrate is executed when the differential pressure falls within an allowable range.

6. A method of processing a substrate comprising the steps of:
   bringing a substrate into a process chamber;
   processing the substrate while supplying a reactive gas into the process chamber with the substrate brought in the process chamber; and
   bringing out the processed substrate from the process chamber,
   wherein in the step of processing the substrate,
   an inside pressure of the process chamber is measured and the inside pressure of the process chamber is led to a predetermined pressure based on a measurement of the inside pressure, and
   after the processing of the substrate, a differential pressure between the inside pressure of the process chamber and an outside pressure outside of the process chamber is measured, and based on the differential pressure, the step of bringing out the processed substrate is executed when the differential pressure falls within an allowable range.

7. A method of processing a substrate comprising the steps of:
   bringing a substrate into a process chamber;
   processing the substrate while supplying a reactive gas into the process chamber with the substrate brought in the process chamber; and
   bringing out the processed substrate from the process chamber,
   wherein in the step of processing the substrate,
   an inside pressure of the process chamber is measured and the inside pressure of the process chamber is led to a predetermined pressure based on a measurement of the inside pressure, and
   a differential pressure between the inside pressure of the process chamber and an outside pressure outside of the process chamber is measured, and based on the differential pressure, the reactive gas is supplied into the process chamber when the inside pressure of the process chamber is smaller than the outside pressure outside of the process chamber.

8. A substrate processing apparatus comprising:
   a process chamber for processing a substrate;
   a reactive gas-supplying line for supplying a reactive gas into the process chamber;
   an exhaust line for exhausting an inside of the process chamber;
   a pressure-adjusting module provided in the exhaust line for adjusting a pressure in the process chamber;
   a first pressure-measuring instrument for measuring an inside pressure of the process chamber;
   a second pressure-measuring instrument for measuring a differential pressure between the inside pressure of the process chamber and an outside pressure outside of the process chamber;
   a lid for hermetically closing an opened portion of the process chamber to take in and take out the substrate; and
   a controller which controls the pressure-adjusting module based on a value of the inside pressure of the process chamber measured by the first pressure-measuring instrument to lead the inside pressure of the process chamber to a predetermined pressure when processing the substrate, and after the processing of the substrate, performs control based on a value of the differential pressure measured by the second pressure-measuring instrument so that opening the hermetically closed lid is allowed when the differential pressure falls within an allowable range.

9. A substrate processing apparatus comprising:
   a process chamber for processing a substrate;
   a reactive gas-supplying line for supplying a reactive gas from a reactive gas-supplying module into the process chamber;
   an exhaust line for exhausting an inside of the process chamber;
   a pressure-adjusting module provided in the exhaust line for adjusting a pressure in the process chamber;
   a first pressure-measuring instrument for measuring an inside pressure of the process chamber;
   a second pressure-measuring instrument for measuring a differential pressure between the inside pressure of the process chamber and an outside pressure outside of the process chamber; and
   a controller which controls the pressure-adjusting module based on a value of the inside pressure of the process chamber measured by the first pressure-measuring instrument to lead the inside pressure of the process chamber to a predetermined pressure, and controls the reactive gas-supplying module based on a value of the differential pressure measured by the second pressure-measuring instrument to allow supply of the reactive gas into the process chamber when the inside pressure of the process chamber is smaller than the outside pressure outside of the process chamber.

10. The substrate processing apparatus according to claim 9, wherein the controller controls the reactive gas-supplying module so that a gaseous mixture composed of $O_2$ gas and at least one kind of gas is selected from a group consisting of $H_2O$ gas, which can be obtained by burning $H_2$ gas and $O_2$ gas, $N_2$ gas, HCl gas, $C_2H_2Cl_2$ gas and $H_2$ gas, or only $O_2$ gas is supplied into the process chamber as the reactive gas when processing the substrate.

11. The substrate processing apparatus according to claim 9, wherein the controller controls the reactive gas-supplying module so that a gas containing a corrosive or toxic gas is supplied into the process chamber as the reactive gas when processing the substrate.

12. The substrate processing apparatus according to claim 9, wherein the controller controls the pressure-adjusting module so that the inside pressure of the process chamber is kept at a pressure within a range of 800 to 1000 hPa when processing the substrate.

13. The substrate processing apparatus according to claim 9, wherein the controller controls the pressure-adjusting module so that the inside pressure of the process chamber is kept at a pressure within a range of 900 to 980 hPa when processing the substrate.

14. The substrate processing apparatus according to claim 9, wherein the controller further performs control based on the value of the differential pressure measured by the second pressure-measuring instrument so that the inside of the process chamber is allowed to be opened when the differential pressure falls within an allowable range after the processing of the substrate.

15. The substrate processing apparatus according to claim 9, wherein the controller further performs control based on the value of the differential pressure measured by the second pressure-measuring instrument so that the processed substrate is allowed to be brought out from inside the process chamber when the differential pressure falls within an allowable range after the processing of the substrate.

16. The substrate processing apparatus according to claim 9, comprising:
    a support tool for supporting the substrate in the process chamber;
    a lid for supporting the support tool and hermetically closing an opened portion of the process chamber to take in and take out the support tool; and
    a lifting mechanism for lifting the lid up and down thereby to lift the support tool up and down,
    wherein the controller further performs control based on the value of the differential pressure measured by the second pressure-measuring instrument so that the lifting mechanism is allowed to be driven when the differential pressure falls within an allowable range after the processing of the substrate.

* * * * *